(12) United States Patent
Kim et al.

(10) Patent No.: US 10,892,445 B2
(45) Date of Patent: Jan. 12, 2021

(54) LIGHT APPARATUS FOR ORGANIC LIGHT EMITTING DEVICE

(71) Applicant: LG Display Co., Ltd., Seoul (KR)

(72) Inventors: Jongmin Kim, Pyeongtaek-si (KR); Taejoon Song, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/200,939

(22) Filed: Nov. 27, 2018

(65) Prior Publication Data

US 2019/0165319 A1 May 30, 2019

(30) Foreign Application Priority Data

Nov. 28, 2017 (KR) .................. 10-2017-0160120

(51) Int. Cl.
*H01L 51/52* (2006.01)
*H01L 27/32* (2006.01)
*H01L 51/00* (2006.01)

(52) U.S. Cl.
CPC ........ *H01L 51/5268* (2013.01); *H01L 27/329* (2013.01); *H01L 27/3279* (2013.01); *H01L 51/5212* (2013.01); *H01L 51/5253* (2013.01); *H01L 51/5275* (2013.01); *H01L 51/5284* (2013.01); *H01L 27/3258* (2013.01); *H01L 51/0097* (2013.01); *H01L 51/5209* (2013.01); *H01L 2251/303* (2013.01);
(Continued)

(58) Field of Classification Search
CPC ............. H01L 51/5268; H01L 51/5284; H01L 51/5275; H01L 51/5253; H01L 51/5212; H01L 51/0097; H01L 27/329; H01L 27/3279; H01L 2251/5361; H01L 2251/5338; H01L 2251/303; H01L 2251/558; H01L 27/3258; H01L 51/5209
See application file for complete search history.

(56) References Cited

U.S. PATENT DOCUMENTS 7,312,571 B2 12/2007 Kim
7,473,932 B2 1/2009 Cho et al.
(Continued)

FOREIGN PATENT DOCUMENTS

CN 1551691 A 12/2004
CN 1719955 A 1/2006
(Continued)

*Primary Examiner* — Patricia D Reddington
(74) *Attorney, Agent, or Firm* — Seed IP Law Group LLP

(57) ABSTRACT

An organic light emitting diode (OLED) lighting apparatus capable of improving lighting efficiency and lifetime by maximizing a light emitting area is disclosed. The OLED lighting apparatus may include a first electrode, which is provided with an embossing pattern at an interface at which the first electrode contacts an overcoat layer on a substrate. The first electrode may be made of a high refractive transparent conductive material, and may be arranged in an entire active area of the OLED lighting apparatus. The OLED lighting apparatus can improve light extraction efficiency through a light scattering due to a microlens effect through the first electrode provided with the embossing pattern, which facilitates elimination of a light extraction layer arranged at the interface between the substrate and the overcoat layer, thereby reducing a process yield and manufacturing cost.

19 Claims, 6 Drawing Sheets

(52) U.S. Cl.
CPC ............. *H01L 2251/5338* (2013.01); *H01L 2251/5361* (2013.01); *H01L 2251/558* (2013.01)

(56) References Cited

U.S. PATENT DOCUMENTS

| | | | |
|---|---|---|---|
| 7,674,407 | B2 | 3/2010 | Takakuwa et al. |
| 7,977,871 | B2 | 7/2011 | Kim |
| 2004/0222740 | A1* | 11/2004 | Kim ................... H01L 51/5228 313/506 |
| 2015/0263311 | A1* | 9/2015 | Park ................... H01L 51/5256 257/40 |
| 2016/0093824 | A1* | 3/2016 | McSporran ............ G02F 1/155 428/336 |
| 2017/0133631 | A1* | 5/2017 | Thompson .......... H01L 51/5234 |

FOREIGN PATENT DOCUMENTS

| | | |
|---|---|---|
| CN | 1758819 A | 4/2006 |
| KR | 10-2012-0123982 A | 11/2012 |
| KR | 10-2013-0041945 A | 4/2013 |
| KR | 10-2014-0014684 A | 2/2014 |

\* cited by examiner

LIGHT APPARATUS FOR ORGANIC LIGHT EMITTING DEVICE

CROSS-REFERENCE TO RELATED APPLICATION(S)

This application claims priority to and the benefit of Korean Patent Application No. 10-2017-0160120, filed on Nov. 28, 2017, the disclosure of which is incorporated herein by reference in its entirety.

BACKGROUND

Technical Field

The present disclosure relates to an OLED lighting apparatus, and more particularly, to an OLED lighting apparatus capable of improving lighting efficiency and lifetime by maximizing a light emitting area.

Description of the Related Art

Currently, a fluorescent lamp or an incandescent lamp is mainly used as a lighting apparatus. Among them, the incandescent lamp has a problem of very low energy efficiency, despite high color rendering index, and the fluorescent lamp has a problem of low color rendering index and contain mercury causing an environmental pollution, despite good energy efficiency.

Accordingly, a light emitting diode (LED) has been proposed as a lighting apparatus capable of replacing the fluorescent lamp or the incandescent lamp. Such an LED is formed of an inorganic light emitting material, and light emitting efficiency thereof has a maximum value in the blue wavelength band and decreases toward the red wavelength band and the green wavelength band, which has the highest visibility. Accordingly, when combining the red light LED, the green LED, and the blue LED to emit a white light, light emitting efficiency is lowered. In addition, when the red LED, the green LED, and the blue LED are used, since the width of each peak is narrow, a color rendering property is reduced.

In order to overcome such problems, there has been proposed a lighting apparatus configured to emit a white light through combination of a blue LED and yellow phosphor instead of combining the red LED with the green LED and the blue LED. This is because a method of obtaining white light through combination of a blue LED having high light emitting efficiency with phosphors that emit yellow light when irradiated with blue light from the blue LED is more efficient than use of a green LED, which has low light emitting efficiency.

However, such a lighting apparatus configured to emit a white light through combination of the blue LED with the yellow phosphor has limited light emitting efficiency of the lighting apparatus due to low light emitting efficiency of the fluorescent material that emits a yellow light.

As described above, in order to solve such a problem of reduction in light emitting efficiency, there has been proposed an organic light emitting diode (OLED) lighting apparatus using an organic light emitting device formed of an organic light emitting material. Generally, the OLED has relatively good light emitting efficiency in the green and red wavelength areas, as compared with an inorganic light emitting device. In addition, such an organic light emitting device exhibits improved the color rendering property due to relatively wide light emitting peak in the blue, red, and green wavelength areas, as compared with an inorganic light emitting device, and thus, the light of the light emitting apparatus is more similar to the sunlight.

BRIEF SUMMARY

It is an object of the present disclosure to provide an organic light emitting diode (OLED) lighting apparatus capable of improving lighting efficiency and lifetime through a maximization of a light emitting area.

For this purpose, in the OLED lighting apparatus according to the present disclosure, a first electrode, which is provided with an embossing pattern at an interface, with which an overcoat layer on the substrate is contacted, and made of a high refractive transparent conductive material, is arranged in an entire active area.

As a result, since the OLED lighting apparatus according to the present disclosure can improve light extraction efficiency through a light scattering due to a microlens effect through the first electrode provided with the embossing pattern, it is possible to remove a light extraction layer arranged at the interface between the substrate and the overcoat layer, thereby reducing a process yield and manufacturing cost.

Further, in the OLED lighting apparatus according to the present disclosure, instead of eliminating an auxiliary line and a protective layer, the first electrode made of a high refractive transparent conductive material is arranged in the entire active area, and a light can be emitted even in a non-light emitting area. Thus, by maximizing the light emitting area, light extraction efficiency can be improved, thereby making it possible to improve a lifetime.

In an OLED lighting apparatus in accordance with an exemplary embodiment of the present disclosure, an overcoat layer is arranged on a substrate, and a first electrode provided with an embossing pattern at an interface, with which the overcoat layer is contacted, is arranged on the overcoat layer.

Accordingly, since the OLED lighting apparatus according to the present disclosure can improve light extraction efficiency through light scattering due to a microlens effect through the first electrode provided with the embossing pattern, it is possible to remove the light extraction layer arranged at the interface between the substrate and the overcoat layer, thereby reducing a process yield and manufacturing cost.

For this purpose, in the OLED lighting apparatus according to the exemplary embodiment of the present disclosure, the first electrode formed of the high refractive transparent conductive material at the interface, with which the overcoat layer on the substrate is contacted, is arranged, and the first electrode has a light emitting portion having an embossing pattern of a first thickness and an auxiliary electrode portion having an embossing pattern of a second thickness thicker than the first thickness.

In addition, in the OLED lighting apparatus in accordance with the exemplary embodiment of the present disclosure, as the light extraction layer arranged at the interface between the substrate and the overcoat layer is removed, it is possible to improve an interfacial adhesion between the substrate and the overcoat layer, thereby improving a reliability degradation due to moisture penetration.

Further, in the OLED lighting apparatus according to the present disclosure, instead of eliminating the auxiliary line and the protective layer, the first electrode made of the high refractive transparent conductive material is arranged in the entire active area and the light can be emitted even in the non-light emitting area. Thus, by maximizing the light emitting area, light extraction efficiency can be improved, thereby making it possible to improve a lifetime.

In the OLED lighting apparatus according to the present disclosure, the first electrode, which has a light emitting portion having the embossing pattern of the first thickness and the auxiliary electrode portion having the embossing pattern of the second thickness thicker than the first thickness at the interface, to which the overcoat layer on the substrate is contacted, and is made of the high refractive transparent conductive material, is arranged in the entire active area.

Accordingly, since the OLED lighting apparatus according to the present disclosure can improve light extraction efficiency through the light scattering due to the microlens effect through the first electrode provided with the embossing pattern, it is possible to remove the light extraction layer arranged at the interface between the substrate and the overcoat layer, thereby reducing the process yield and manufacturing cost.

In addition, in the OLED lighting apparatus in according to the present disclosure, as the light extraction layer arranged at an interface between the substrate and the overcoat layer is arranged, it is possible to improve the interfacial adhesion between the substrate and the overcoat layer, thereby improving the reliability degradation due to the water penetration.

Further, in the OLED lighting apparatus according to the present disclosure, instead of eliminating an auxiliary line and the protective layer, the first electrode made of a high refractive transparent conductive material is arranged in the entire active area and the light can be emitted even in the non-light emitting area. Thus, by maximizing the light emitting area, light extraction efficiency can be improved, thereby making it possible to improve the lifetime.

Further, since the OLED lighting apparatus according to the present disclosure is not arranged with the auxiliary line and the protective layer, and the first electrode having the light emitting portion and the auxiliary electrode portion having the embossing pattern is coated so as to cover the entire upper portion of the overcoat layer on the substrate. Thus, it has a flat surface structure, and a stepped coverage does not exist, thereby preventing a disconnection defect of the organic light emitting layer and the second electrode due to the stepped coverage.

DETAILED DESCRIPTION

Figure 1:
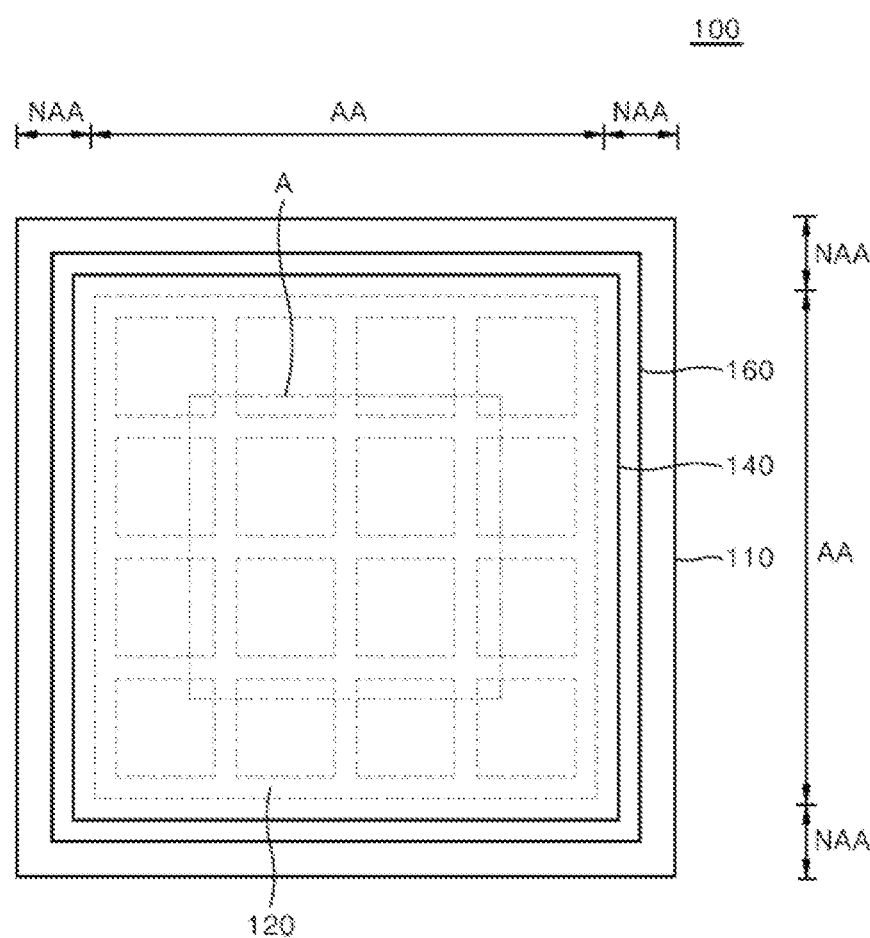
FIG. 1 is a plan view showing an organic light emitting diode (OLED) lighting apparatus in accordance with a first embodiment of the present disclosure.

The above-mentioned objects, features, and advantages of the present disclosure will be described in detail with reference to the accompanying drawings, and accordingly, the technical idea of the present disclosure can be easily performed by those skilled in the art. In describing the present disclosure, when it is determined that the detailed description of the known technique related to the present disclosure may unnecessarily obscure the gist of the preset disclosure, a detailed description will be omitted. Hereinafter, the preferred embodiments according to the present disclosure will be described in detail with reference to the accompanying drawings. In the drawings, the same reference numerals are used to indicate the same or similar components.

Hereinafter, an organic light emitting diode (OLED) lighting apparatus in accordance with the preferred embodiments of the present disclosure will be described in detail with reference to the accompanying drawings.

Figure 2:
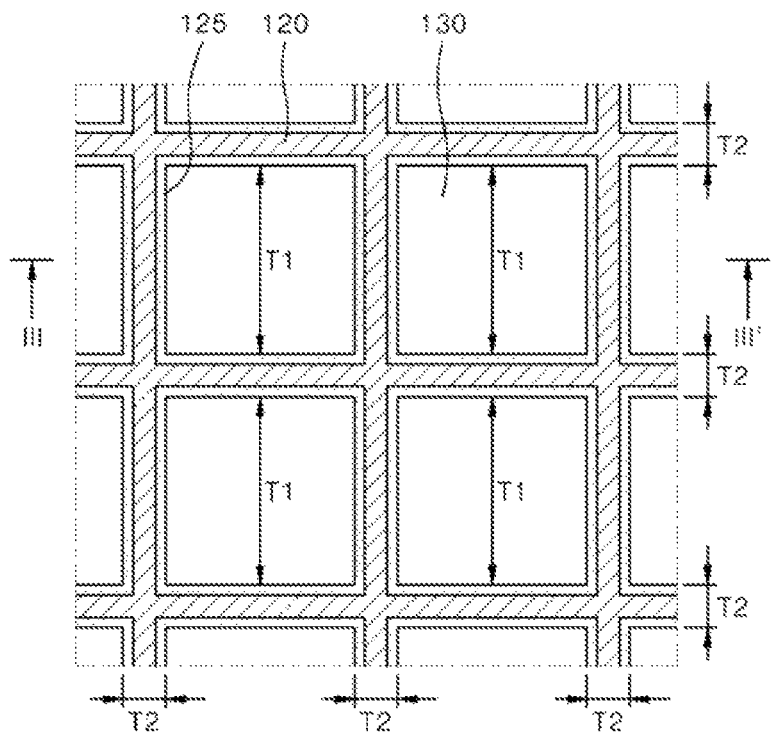
FIG. 2 is an enlarged plan view showing a portion A of FIG. 1.
Figure 3:
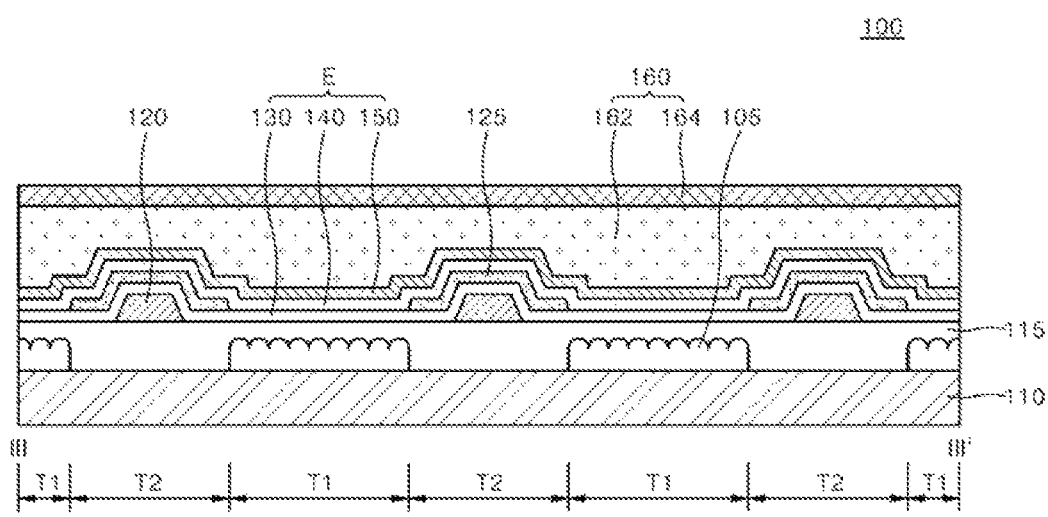
FIG. 3 is a sectional view showing taken along line III-III' of FIG. 2.

FIG. 1 is a plan view showing an OLED lighting apparatus in accordance with a first embodiment of the present disclosure, and FIG. 2 is an enlarged plan view showing a portion A of FIG. 1, and FIG. 3 is a cross-sectional view showing taken along line III-III' of FIG. 2.

Referring to FIGS. 1 to 3, in the OLED lighting apparatus 100 in accordance with the first embodiment of the present disclosure, an overcoat layer 115 is arranged on a substrate 110 and an organic light emitting device E is arranged on the overcoat layer 115.

The overcoat layer 115 serves to block moisture and air penetrating from a lower portion of the substrate 110 in addition to flattening a surface of the substrate 110. For this purpose, the overcoat layer 115 may be formed of an organic material including photo acrylic (PAC). The overcoat layer 115 may also be made of an inorganic material including any one of silicon nitride (SiNx), silicon oxide (SiOx), and aluminum oxide (AlOx). The overcoat layer 115 may also be formed of a plurality of layers including an inorganic layer and an organic layer.

The organic light emitting device E includes a first electrode 130 arranged on an overcoat layer 115, an organic light emitting layer 140 stacked on the first electrode 130, and a second electrode 150 stacked on the organic light emitting layer 140. In the OLED lighting apparatus 100 having such a structure, the organic light emitting layer 140 emits a light when a signal is applied to a first electrode 130 and a second electrode 150 of the organic light emitting device E, thereby a light can be emitted over the entire substrate 110.

At this time, the substrate 110 may be divided into an active area AA in which an organic light emitting device E is arranged and a non-active area NAA in which an organic light emitting device E is not arranged outside the active area AA. In the active area AA on the substrate 110, an auxiliary line 120 is arranged in a matrix shape to divide the active area AA of the substrate 110 into a plurality of pixel units.

The active area AA may be divided into a first area T1 in which a light emitted from the organic light emitting device E emits a light and a second area T2 in which the light emitted from the organic light emitting device E by the auxiliary line 120 arranged in the matrix form is blocked and not emitted.

The auxiliary line 120 is formed of a metal having good electrical conductivity to allow a uniform voltage to be applied to the first electrode 130 arranged over the entire active area AA on the substrate 110, thereby making it possible to emit a light at a uniform luminance in a large area OLED lighting apparatus 100. The auxiliary line 120 may be arranged between the overcoat layer 115 and the first electrode 130 to be connected in a form directly contacting the first electrode 130.

The first electrode 130 is formed of a transparent conductive material, such as ITO, and transmits an emitted light therethrough. However, the first electrode 130 has a very high electric resistance compared to a metal. Accordingly, when the large area OLED lighting apparatus 100 is manufactured, a current spreading applied to a wide area is not uniform due to high resistance of the transparent conductive material. Such a non-uniform current spreading makes it impossible for the large area OLED lighting apparatus 100 to emit a light with a uniform luminance.

The auxiliary line 120 is arranged in the matrix form over the entire substrate 110 to allow a uniform voltage to be applied to the first electrode 130 on the entire substrate 110, thereby the large area OLED lighting apparatus 100 can emit a light with the uniform luminance. That is, since the auxiliary line 120 has much lower resistance than the first electrode 130, a voltage for the first electrode 130 is applied to the first electrode 130 through the auxiliary line 120 rather than being directly applied to the first electrode 130. Therefore, although the first electrode 130 is formed over the entire substrate 110, the first electrode 130 can be divided into the plurality of pixel units by the auxiliary line 120.

For this purpose, the auxiliary line 120 may be formed of one, or two or more of alloy materials selected from Al, Au, Cu, Ti, W, Mo, and Cr. The auxiliary line 120 may be formed of a single-layer structure or may have a multi-layer structure of two or more layers.

A protective layer 125 is stacked in an upper portion of the first electrode 130. This protective layer 125 is arranged on the first electrode 130 to cover the auxiliary line 120.

The protective layer 125 may be formed of an inorganic layer, such as SiOx or SiNx. In addition, the protective layer 125 may be formed of an organic material, such as PAC, or may be formed of a plurality of layers including an inorganic layer and an organic layer.

At this time, since the auxiliary line 120 is made of an opaque metal, the second area T2 in which the auxiliary line 120 is formed becomes a non-light emitting area in which no light is emitted. Accordingly, the protective layer 125 is provided only at an upper portion of the second area T2 in which the auxiliary line 120 is disposed and the protective layer 125 is not arranged at the first area T1 in which the auxiliary line 120 is not arranged, on the first electrode 130. As a result, the light is emitted only in the first area T1 corresponding to a light emitting area of a pixel to emit a light.

The organic light emitting layer 140 and the second electrode 150 are sequentially arranged on the upper part of the first electrode 130 and the protective layer 125.

The organic light emitting layer 140 may be formed of an organic light emitting material that emits a white light. For example, the organic light emitting layer 140 may be formed of a blue organic light emitting layer, a red organic light emitting layer, and a green organic light emitting layer and may be formed of a tandem structure including a blue light emitting layer and a yellow-green light emitting layer. However, the organic light emitting layer 140 of the present disclosure is not limited to the above structure, but various structures may be applied.

Although not shown in the drawings, the organic light emitting device E may further include an electron injection layer and a hole injection layer to inject an electron and a hole into the organic light emitting layer 174, an electron transport layer and a hole transport layer to transport an injected electron and hole into an organic light emitting layer 140, respectively, and a charge generation layer to generate a charge such as an electron and a hole.

The organic light emitting layer 140 is a material that emits a light in a visible light area by transporting the hole and the electron from the hole transport layer and the electron transport layer, respectively, and combining them, and a material having good quantum efficiency for a fluorescence or a phosphorescence is preferable. As the organic materials, for example, 8-hydroxy-quinoline aluminum complex (Alq3), a carbazol-based compound, a dimerized styryl compound, BAlq, a 10-hydroxybenzo quinoline-metal compound, a benzoxazole, benzthiazol, and benzimidazole-based compound, poly-P-phenylenevinylene (PPV) may be used, but is not limited thereto.

The second electrode 150 may be formed of a metal, such as Ca, Ba, Mg, Al, and Ag, or an alloy thereof.

The first electrode 130, the organic light emitting layer 140, and the second electrode 150 form an organic light emitting device E. Here, the first electrode 130 is an anode of the organic light emitting device E and the second electrode 150 is a cathode of the organic light emitting device E. When a voltage is applied to the first electrode 130 and the second electrode 150, the electron is injected from the second electrode 150 to the organic light emitting layer 140 and the hole is injected from the first electrode 130 to the organic light emitting layer 140, thereby generating an exciton in the organic light emitting layer 140. As the exciton decays, a light corresponding to an energy difference between a lowest unoccupied molecular orbital (LUMO) and a highest occupied molecular orbital (HOMO) of the organic light emitting layer 140 is generated and emitted toward the substrate 110.

In addition, the OLED lighting apparatus 100 in accordance with the first embodiment of the present disclosure may further include an encapsulation layer 160 arranged to cover the second electrode 150 on the substrate 110 having the organic light emitting device E formed thereon.

The encapsulation layer 160 may include an adhesive layer 162 and a base material layer 164 arranged on the adhesive layer 162. As described above, the encapsulation layer 160 is arranged on the substrate 110 having the organic light emitting device E thereon such that the OLED lighting apparatus 100 can be sealed by the base material layer 164 attached to the adhesive layer 162.

Here, the adhesive layer 162 may use a photocurable adhesive or a thermosetting adhesive. The base material layer 164 is arranged to prevent a penetration of moisture or air from an outside and may be formed of any material as long as the material can perform this function. For example, as the material of the base material layer 164, a polymer material, such as polyethylene terephthalate (PET) may be applied, or may be formed of a metal material, such as an aluminum foil, an Fe—Ni alloy, or an Fe—Ni—Co alloy.

Meanwhile, as shown in FIG. 3, the OLED lighting apparatus 100 in accordance with the first embodiment of the present disclosure has a light extraction layer 105 of a microlens pattern structure inserted into an inside of the substrate 110, thereby improving light extraction efficiency through a light scattering by the microlens pattern of the light extraction layer 105.

For this purpose, the OLED lighting apparatus 100 in accordance with the first embodiment of the present disclosure attaches the light extraction layer 105 of the microlens pattern structure on the substrate 110, and then, arranges the overcoat layer 115 to cover the substrate 110 attached with the light extraction layer 105.

As described above, the light extraction layer 105 is arranged at an interface between the substrate 110 and the overcoat layer 115, and a reflection of a light at the interface of the substrate 110 and the overcoat 115 is reduced through the light scattering by the microlens pattern, thereby improving extraction efficiency of a light emitted from the organic light emitting layer 140.

However, in the OLED lighting apparatus 100 in accordance with the first embodiment of the present disclosure, as the light extraction layer 105 manufactured separately is attached to the interface between the substrate 110 and the overcoat layer 115, an adhesive between the substrate 110 and the overcoat layer 115 is not good, and it acts as a path that water is penetrated into the interface between the light extraction layer 105 and the substrate 110 due to an adhesive degradation, thereby a reliability of the OLED lighting apparatus 100 is degraded due to a moisture penetration.

In addition, the OLED lighting apparatus 100 in accordance with the first embodiment of the present disclosure has to arrange an auxiliary line 120 arranged to apply the uniform voltage to the first electrode 130 made of a transparent conductive material such as ITO and a protective layer 125 that is arranged on the first electrode 130 to cover the auxiliary line 120, and it becomes a non-light emitting area that does not emit a light to the second area T2 formed with the auxiliary line 120 formed of the opaque metal, thereby degrading light extraction efficiency.

In order to solve this problem, in the OLED lighting apparatus in accordance with the second embodiment of the present disclosure, the first electrode, which is provided with an embossing pattern at the interface, with which the overcoat layer on the substrate is contacted, and is made of a high refractive transparent conductive material, is arranged in the entire active area, so that the auxiliary line and the protective layer can be eliminated.

As a result, the OLED lighting apparatus in accordance with the second embodiment of the present disclosure can improve light extraction efficiency through the light scattering due to the microlens effect through the first electrode provided with the embossing pattern, so that the light extraction layer arranged at the interface between the substrate and the overcoat layer can be reduced, resulting in a reduction in a process yield and manufacturing cost.

Further, in the OLED lighting apparatus in accordance with the second embodiment of the present disclosure, instead of eliminating the auxiliary line and the protective layer, since the first electrode made of a high refractive transparent conductive material is arranged in the entire active area and the light can be emitted even in the non-light emitting area, by maximizing the light emitting area, light extraction efficiency can be improved, thereby making it possible to improve a lifetime.

This will be described in more detail with reference to the accompanying drawings.

Figure 4:
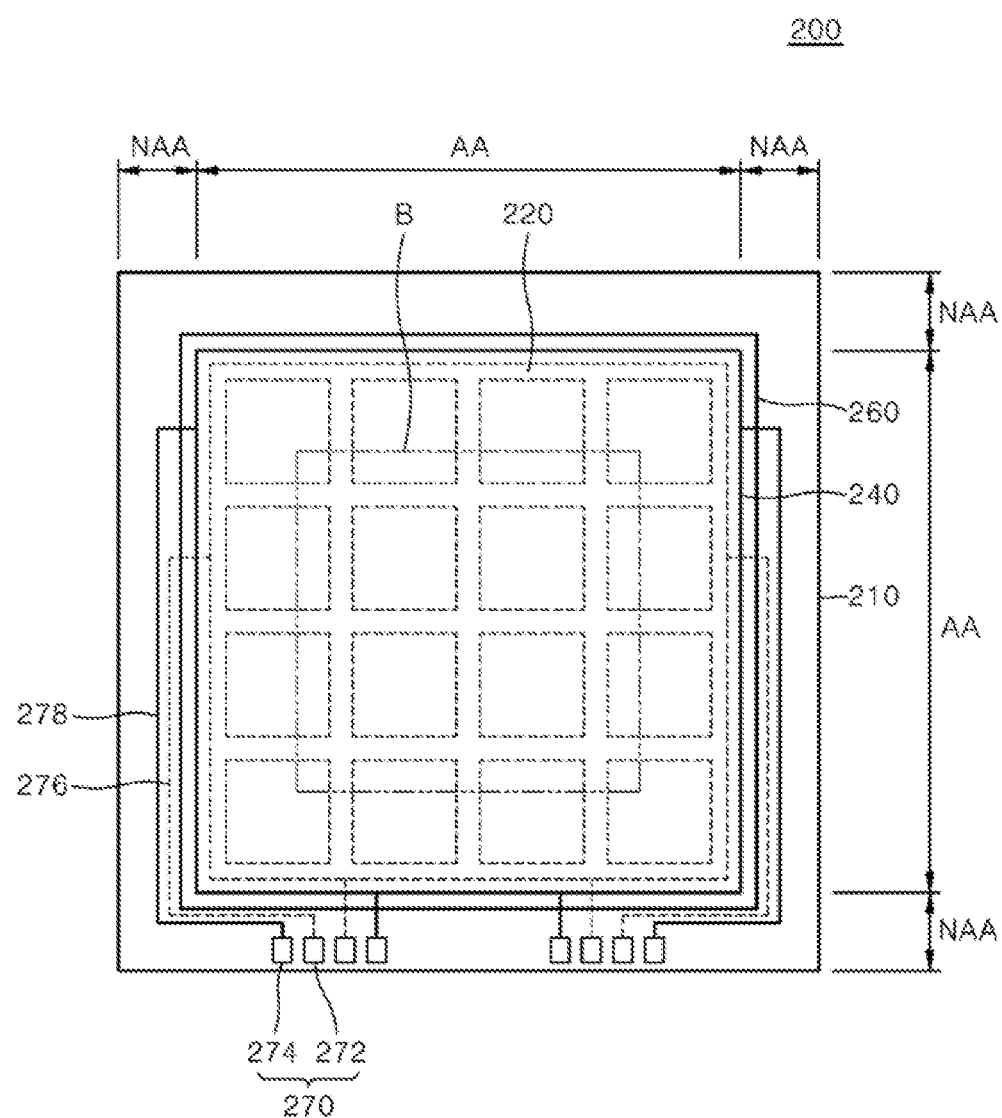
FIG. 4 is a plan view showing an OLED lighting apparatus in accordance with a second embodiment of the present disclosure.
Figure 5:
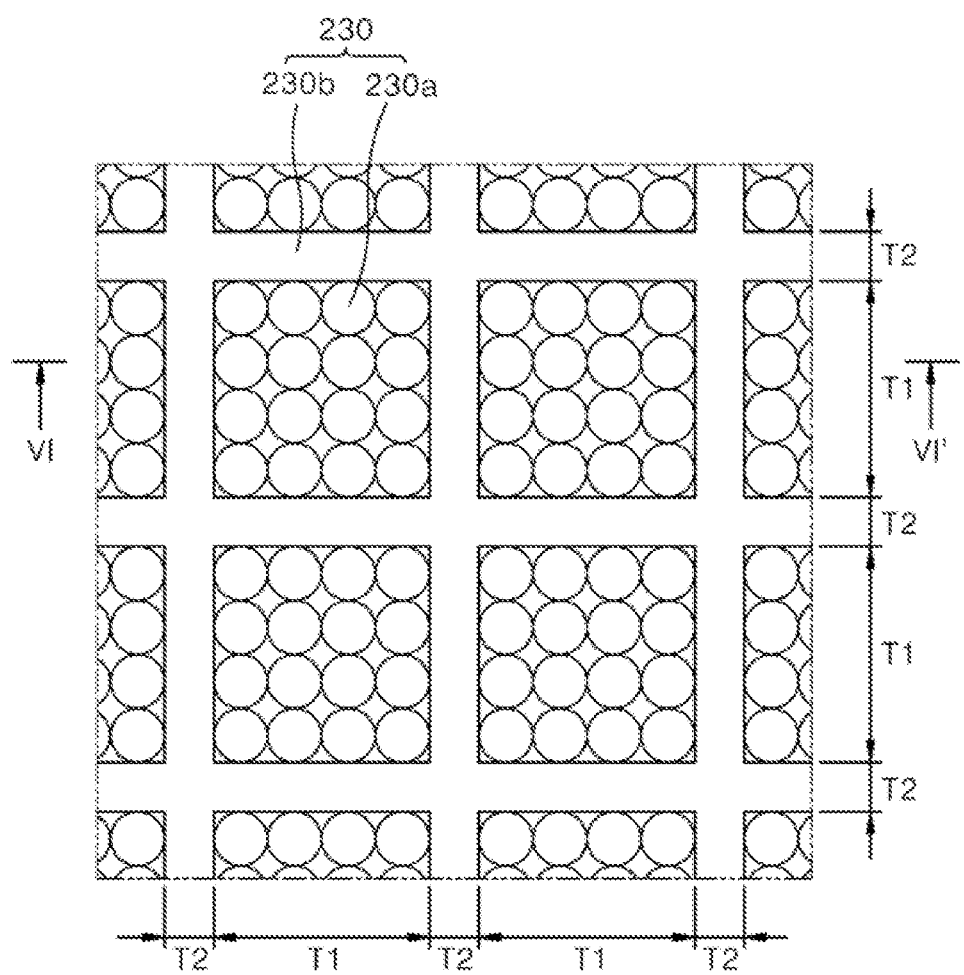
FIG. 5 is an enlarged cross-sectional view showing a portion B of FIG. 4.
Figure 6:
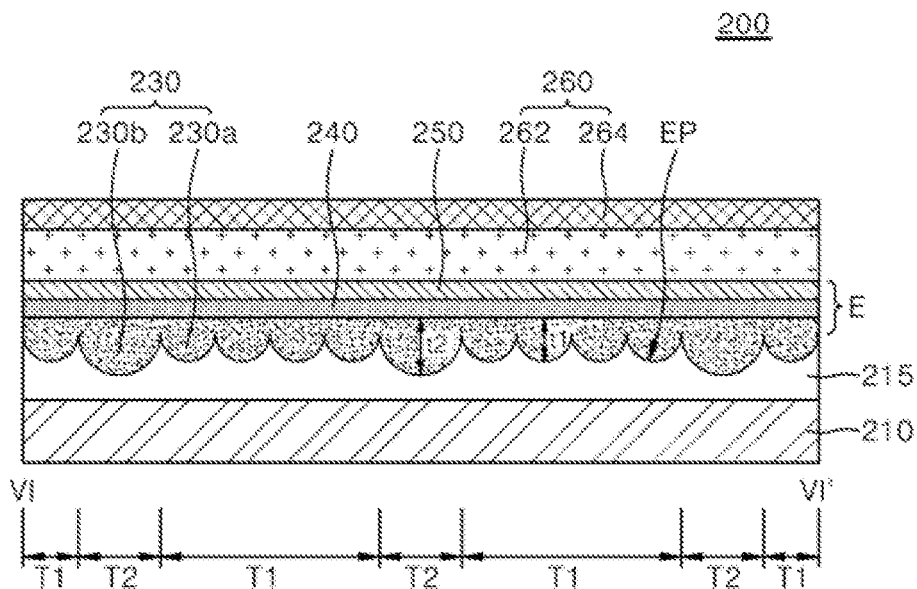
FIG. 6 is a cross-sectional view taken along line VI-VI' of FIG. 5.

FIG. 4 is a plan view showing an OLED lighting apparatus in accordance with a second embodiment of the present disclosure and FIG. 5 is an enlarged cross-sectional view showing a part B of FIG. 4, and FIG. 6 is a cross-sectional view showing by taken along line VI-VI' of FIG. 5.

Referring to FIGS. 4 to 6, the OLED lighting apparatus 200 in accordance with the second embodiment of the present disclosure includes a substrate 210, an overcoat layer 215, a first electrode 230, an organic light emitting layer 240, and a second electrode 250.

The substrate 210 may use a transparent glass material. Further, the substrate 210 may use a polymer material having a flexible property.

The overcoat layer 215 is arranged on the substrate 210 and an organic light emitting device E is arranged on the overcoat layer 215.

At this time, the substrate 210 may be divided into an active area AA in which an organic light emitting device E is arranged and an non-active area NAA in which an organic light emitting device E is not arranged outside the active area AA.

The overcoat layer 215 serves to block moisture and air penetrating from a lower portion of the substrate 210 in addition to flattening a surface of the substrate 210. For this purpose, the overcoat layer 215 may be formed of an organic material including photo acrylic (PAC). The overcoat layer 215 may also be made of an inorganic material including any one of silicon nitride (SiNx), silicon oxide (SiOx), and aluminum oxide (AlOx). In addition, the overcoat layer 215 may be formed of a plurality of layers including an inorganic layer and an organic layer.

The first electrode 230 is stacked on the overcoat layer 215 and an embossing pattern EP is provided at the interface with which the overcoat layer 215 is contacted. That is, the first electrode 230 and the overcoat layer 215 together define the embossing pattern EP at the interface between the first electrode 230 and the overcoat layer 215. The first electrode 230 covers an entire upper surface of the overcoat layer 215 on the substrate 210 and has a flat surface. Accordingly, the first electrode 230 has a surface in which a part thereof is embedded inside the overcoat layer 215.

The first electrode 230 is made of a high refractive transparent conductive material. For this purpose, the first electrode 230 may include a binder, a conductive material, and light scattering beads (which may be referred to herein collectively as a light scattering bead).

Referring back to FIG. 3, in general, the light emitted from the organic light emitting layer 140 does not pass an interface and is reflected due to a refractive index difference of the adjacent layers to each other at an interface between the organic light emitting layer 140 and the first electrode 130 and an interface between the first electrode 130 and the substrate 110 and a waveguide of a reflected light is made inside the first electrode 130 and the substrate 110 to be transmitted to a side cross-section of the first electrode 130 and the substrate 110. At this time, about 80% of the light emitted from the organic light emitting layer 140 is reflected at the interface of each layer, and only 20% thereof is emitted to an outside. Due to a light loss, not only power efficiency of the OLED lighting apparatus 100 but also light extraction efficiency of the OLED lighting apparatus 100 is degraded, thereby a lifetime is degraded.

Meanwhile, as shown in FIGS. 4 to 6, in the second embodiment of the present disclosure, the difference in refractive index between the first electrode 230 and the substrate 210 is reduced by dispersing the light scattering bead in the first electrode 230, thereby reducing a light reflection at the interface between the first electrode 230 and the substrate 210.

For this purpose, it is preferable that the first electrode 230 includes 100 to 300 parts by weight of the conductive material and 50 to 200 parts by weight of the light scattering bead, based on 100 parts by weight of the binder.

The binder may include at least one or more selected from tetraethlyorthosilicate (TEOS), silsesquioxane (SSQ), and polysiloxane (Poly siloxane).

The conductive material may include at least one or more selected from poly(3,4-ethylenedioxythiophene) (PEDOT), Carbon Nano Tube (CNT), graphene, Cu-nanowire Ag-nanowire, and Au-nanowire.

The light scattering bead can use a high refractive light scattering particle. Any material can be used as long as the high refractive light scattering material has a set refractive index. Specifically, at least one or more selected from $TiO_2$, $BaTiO_3$, $ZrO_2$, ZnO, $SiO_2$ and SiO, etc., can be used.

At this time, by controlling an added amount of the conductive material added to the binder to an optimal content ratio, it is possible to control a conductivity of the first electrode 230. At this time, in the second embodiment of the present disclosure, the first electrode 230 may have a low resistance of 1,000Ω or less.

For this purpose, it is preferable that the conductive material includes 100 to 300 parts by weight based on 100 parts by weight of the binder. When the conductive material is added in an amount of less than 100 parts by weight based on 100 parts by weight of the binder, it may be difficult to ensure a conductivity. On the contrary, when the conductive material is added in an amount exceeding 300 parts by weight based on 100 parts by weight of the binder, an excessive adding of the conductive material can degrade a transmittance, which is not preferable.

In addition, it is preferable that the light scattering bead includes 50 to 200 parts by weight based on 100 parts by weight of the binder. When the light scattering bead is added in an amount of less than 50 parts by weight based on 100 parts by weight of the binder, it may be difficult to exhibit a light scattering effect properly. On the other hand, when the light scattering bead is added in a large amount exceeding 200 parts by weight based on 100 parts by weight of the binder, it acts as a factor for increasing a manufacturing cost without further increasing the effect, which is not economical.

A refractive index of the first electrode (130 in FIG. 3) formed of the transparent conductive material such as commonly used ITO is about 1.9, and a refractive index of the substrate 210 made of a glass is about 1.5. On the other hand, since the first electrode 230 of the second embodiment of the present disclosure is formed of the high refractive transparent conductive material in which the light scattering bead is dispersed on the binder and the conductive material, a refractive index of the first electrode 230 is reduced to 1.65 or less. In other words, in the OLED lighting apparatus 200 in accordance with the second embodiment of the present disclosure, the refractive index difference at the interface between the first electrode 230 and the substrate 210 by the light scattering bead in the first electrode 230 is reduced, and a reflection of the light at the interface between the first electrode 230 and the substrate 210 can be reduced, and as a result, increasing an amount of light transmitting the first electrode 230.

In addition, the first electrode 230 may further include an additive such as a leveling agent and a surface agent. Such an additive may be added in an amount of 2 parts by weight or less based on 100 parts by weight of the binder.

In particular, the first electrode 230 in accordance with the second embodiment of the present disclosure includes a light emitting portion 230a having an embossing pattern EP of a first thickness t1 and an auxiliary electrode portion 230b having an embossing pattern EP of a second thickness t2 thicker than the first thickness t1. The embossing pattern EP may include a plurality of first curves, in which the light emitting portions 230a of the first electrode 230 extend downwardly (e.g., toward the substrate 210) with a curved surface that has a maximum thickness of the first thickness t1. The embossing pattern EP may further include a plurality of second curves, in which the auxiliary electrode portions 230b of the first electrode 230 extend downwardly with a curved surface that has a maximum thickness of the second thickness t2. The overcoat layer 215 has corresponding curves (or indentations) on a surface of the overcoat layer 215, such that the curved surfaces of the light emitting portions 230a and the auxiliary electrode portions 230b of the first electrode 230 are in continuous contact with the corresponding curves on the surface of the overcoat layer 215.

As described above, as the first electrode 230 having the light emitting portion 230a having the embossing pattern EP of a first thickness t1 and the auxiliary electrode portion 230b having the embossing pattern EP of a second thickness t2 thicker than the first thickness t1 at the interface, with which the overcoat layer 215 on the substrate 210 is contacted, is arranged over the entire active area AA, the light emitted from the organic light emitting layer 240 at the interface between the substrate 210 and the first electrode 230 is scattered, thereby improving light extraction efficiency.

Accordingly, the OLED lighting apparatus 200 in accordance with the second embodiment of the present disclosure can improve light extraction efficiency through the light scattering by the microlens effect through the first electrode 230 provided with the embossing pattern EP, it is possible to remove the light extraction layer (105 in FIG. 3) arranged at the interface between the substrate 210 and the overcoat layer 215, thereby reducing the process yield and manufacturing cost.

In addition, in the OLED lighting apparatus 200 in accordance with the second embodiment of the present disclosure, as the light extraction layer arranged at the interface between the substrate 210 and the overcoat layer 215 is removed, it is possible to improve an interfacial adhesive between the substrate 210 and the overcoat layer 215, thereby improving a reliability degradation of the OLED lighting apparatus 100 due to water penetration.

At this time, the auxiliary electrode portion 230b of the first electrode 230 is arranged in a matrix form in the active area AA on the substrate 210, thereby dividing the active area AA of the substrate 210 into a plurality of pixel units. Accordingly, the active area AA on the substrate 210 may be divided into a first area T1 arranged with the light emitting portion 230a of the first electrode 230 and a second area T2 arranged with the auxiliary electrode portion 230b of the first electrode 230.

As described above, in the OLED lighting apparatus 200 in accordance with the second embodiment of the present disclosure, the light emitting portion 230a of the first electrode 230 is arranged in the first area T1, and the auxiliary electrode portion 230b of the first electrode 230 is arranged in the second area T2. At this time, the auxiliary electrode portion 230b of the first electrode 230 is formed of a high refractive transparent conductive material, which is identical to the light emitting portion 230a of the first electrode 230, the light emitted from the organic light emitting device E passes through the second area T2, in which the auxiliary electrode portion 230b of the first electrode 230 is arranged, to emit a light.

Accordingly, in the OLED lighting apparatus 200 in accordance with the second embodiment of the present disclosure, instead of eliminating the auxiliary line and the protective layer, the first electrode 230 made of the high refractive transparent conductive material is arranged over the entire active area AA, the light can be emitted even in the non-light emitting area, so that light extraction efficiency can be improved and the lifetime can be improved by maximizing the light emitting area.

At this time, the auxiliary electrode portion 230b of the first electrode 230 is formed thicker than the light emitting portion 230a of the first electrode 230, so that the uniform voltage is applied to the light emitting portion 230a of the first electrode 230 so that the large area OLED lighting apparatus 200 can emit a light with a uniform luminance.

That is, in the OLED lighting apparatus 200 in accordance with the second embodiment of the present disclosure, the thickness of the auxiliary electrode portion 230b of the first electrode 230 arranged in the second area T1 is set to be thicker than the thickness of the light emitting portion 230a of the first electrode 230 arranged in the first area T1, it is possible to reduce an electrical resistance of the auxiliary electrode portion 230b of the first electrode 230 to a level similar to that of the metal.

For this purpose, it is preferable that the auxiliary electrode portion 230b of the first electrode 230 is controlled to have a thickness thicker as at least 1.5 times or more compared to the light emitting portion 230a of the first electrode 230. More specifically, it is preferable that the second thickness t2, which is the thickness of the auxiliary electrode portion 230b of the first electrode 230, is within a range of 150% to 400% compared to the first thickness t1, which is the thickness of the light emitting portion 230a of the first electrode 230. When the second thickness t2 is less than 150% compared to the first thickness t1, it may be difficult to lower the electrical resistance. On the contrary, when the second thickness t2 exceeds 400% compared to the first thickness t1, it acts as a factor to increase only the thickness without further increasing the effect, thereby increasing the manufacturing cost and time, and lowering the process yield.

Accordingly, the first electrode 230 is made of the high refractive transparent conductive material and can transmit an emitted light. Only the thickness of the auxiliary electrode portion 230b of the first electrode 230 is selectively increased, thereby the resistance of the auxiliary electrode portion 230b of the first electrode 230 in arranged in the second area T2 is lowered to a level similar to that of the metal. As a result, the auxiliary electrode portion 230b of the first electrode 230 substantially plays the same role as the auxiliary line of the metal, so that a spreading of the current is uniformly applied, and it is possible to emit a light of the uniform luminance.

Meanwhile, as shown in FIG. 3, in the first embodiment of the present disclosure, although the protective layer 125, which is arranged on the first electrode 130 and covers the auxiliary line 120, reduces a part of a stepped coverage due to the auxiliary line 120, it is difficult to completely remove the stepped coverage due to the auxiliary line 120, resulting in that the organic light emitting layer 140 and the second electrode 150, etc., stacked on the first electrode 130 are disconnected.

Meanwhile, as shown in FIGS. 5 and 6, the OLED lighting apparatus 200 in accordance with the second embodiment of the present disclosure is removed with the auxiliary line and the protective layer, and the first electrode having the light emitting portion 230a and the auxiliary electrode portion 230b having the embossing pattern EP is coated so as to cover the entire upper portion of the overcoat layer 215 on the substrate 210. Thus, it has a flat surface structure and the stepped coverage does not exist. Accordingly, it is possible to prevent a disconnection defect of the organic light emitting layer 240 and the second electrode 250 due to the stepped coverage.

Meanwhile, the organic light emitting layer 240 is stacked on the first electrode 230 and the second electrode 250 is stacked on the organic light emitting layer 240.

The organic light emitting layer 240 may be formed of an organic light emitting material that emits a white light. For example, the organic light emitting layer 240 may be formed of a blue organic light emitting layer, a red organic light emitting layer, and a green organic light emitting layer and may be formed of a tandem structure including a blue light emitting layer and a yellow-green light emitting layer. However, the organic light emitting layer 240 of the present disclosure is not limited to the above structure, but various structures can be applied.

In addition, although not shown in the drawings, the organic light emitting device E may further include an electron injection layer and a hole injection layer to inject an electron and a hole into the organic light emitting layer 240, respectively, an electron transport layer and a hole transport layer to transport an injected electron and hole to the organic light emitting layer, and a charge generation layer to generate a charge such as an electron and a hole.

The organic light emitting layer 174 is a material that emits a light in a visible light area by transporting the hole and the electron from the hole transport layer and the electron transport layer, respectively, and combining them, and a material having good quantum efficiency for a fluorescence or a phosphorescence is preferable. As the organic materials, for example, 8-hydroxy-quinoline aluminum complex (Alq3), a carbazol-based compound, a dimerized styryl compound, BAlq, a 10-hydroxybenzo quinoline-metal compound, a benzoxazole, benzthiazol, and benzimidazole-based compound, poly-P-phenylenevinylene (PPV) may be used, but is not limited thereto.

The second electrode 250 may be formed of a metal, such as Ca, Ba, Mg, Al, and Ag, or an alloy thereof.

At this time, the first electrode 230 is an anode of the organic light emitting device E and the second electrode 250 is a cathode of the organic light emitting device E. When a voltage is applied to the first electrode 230 and the second electrode 250, the electron is injected from the second electrode 250 to the organic light emitting layer 240 and the hole is injected from the first electrode 230 to the organic light emitting layer 240, thereby generating an exciton in the organic light emitting layer 240. As the exciton decays, a light corresponding to an energy difference between a lowest unoccupied molecular orbital (LUMO) and a highest occupied molecular orbital (HOMO) of the organic light emitting layer 240 is generated and emitted toward the substrate 110.

In addition, the OLED lighting apparatus 200 in accordance with the second embodiment of the present disclosure may further include a pad 270 connected to the first electrode 230 and the second electrode 250, respectively, and arranged in the non-active area NAA. At this time, the pad 270 is connected to the first electrode 230 and the second electrode 250, respectively, and receives a voltage from the outside. For this purpose, the pad 270 may include a first pad 272 connected to the first electrode 230 and a second pad 274 connected to the second electrode 250. The first pad 272 and the second pad 274 are electrically connected to the first electrode 230 and the second electrode 250, respectively, through a first connection line 276 and a second connection line 278.

In FIG. 4, although the pad 270 is arranged at an edge area of one side of the substrate 210, it is an illustrative and the position and the number thereof can be changed in various forms. That is, the pad 270 can be arranged at an edge area of both sides, respectively, or can be arranged at an edge area of four sides of the substrate 210, respectively.

At this time, the pad 270 may be formed of the same high refractive transparent conductive material as the auxiliary electrode portion 230b of the first electrode 230, and may have a second thickness.

In addition, the OLED lighting apparatus 200 in accordance with the second embodiment of the present disclosure may further include an encapsulation layer 260.

The encapsulation layer 260 is stacked to cover an upper portion of a substrate 210, in which an organic light emitting device E is arranged, to seal the organic light emitting device E.

The encapsulation layer 260 may include an adhesive layer 262 and a base material layer 264 arranged on the adhesive layer 262. As described above, the encapsulation layer 260 including the adhesive layer 262 and the base material layer 264 is arranged on the substrate 110 having the organic light emitting device E formed thereon, such that the OLED lighting apparatus 200 can be sealed by the base material layer 264 attached to the adhesive layer 262.

Here, as an adhesive layer 262, a photocurable adhesive or a thermosetting adhesive can be used. The base material layer 264 is arranged to prevent moisture or air penetrating from the outside and may be formed of any material as long as the material can perform this function. For example, as the material of the base material layer 264, a polymer material, such as polyethylene terephthalate (PET) may be applied, or may be formed of a metal material, such as an aluminum foil, an Fe—Ni alloy, or an Fe—Ni—Co alloy, etc.

In the OLED lighting apparatus 200 in accordance with the second embodiment of the present disclosure, as the first electrode, which has the light emitting portion 230a having the embossing pattern EP of the first thickness t1 and the auxiliary electrode portion 230b having the embossing pattern EP of the second thickness t2 thicker than the first thickness t1 at the interface with which the overcoat layer 215 on the substrate 210 is contacted, and is made of a high refractive transparent conductive material, is arranged over the entire active area AA, the light emitted from the organic light emitting layer 240 is scattered at the interface between the overcoat layer 215 on the substrate 210 and the first electrode 230, thereby improving light extraction efficiency.

Accordingly, since the OLED lighting apparatus 200 in accordance with the second embodiment of the present disclosure can improve light extraction efficiency through the light scattering by the microlens effect through the first electrode 230 provided with the embossing pattern EP, it is possible to remove the light extraction layer arranged at the interface between the substrate 210 and the overcoat layer 215, thereby reducing the process yield and manufacturing cost.

In addition, in the OLED lighting apparatus 200 in accordance with the second embodiment of the present disclosure, as the light extraction layer arranged at the interface between the substrate 210 and the overcoat layer 215 is removed, it is possible to improve an interfacial adhesion between the substrate 210 and the overcoat layer 215, thereby improving the reliability degradation due to water penetration.

Further, in the OLED lighting apparatus 200 in accordance with the second embedment of the present disclosure, instead of eliminating the auxiliary line and the protective layer, since the first electrode 230 made of the high refractive transparent conductive material is arranged in the entire active area AA, and the light can be emitted even in the non-light emitting area, by maximizing the light emitting area, light extraction efficiency can be improved, thereby making it possible to improve the lifetime.

Further, since the OLED lighting apparatus 200 in accordance with the second embodiment of the present disclosure is not arranged with the auxiliary line and the protective layer and the first electrode 230 having the light emitting portion 230a and the auxiliary electrode portion 230b having the embossing pattern EP is coated so as to cover the entire upper portion of the overcoat layer 215 on the substrate 210. Thus, it has a flat surface structure, and the stepped coverage does not exist, thereby preventing the disconnection defect of the organic light emitting layer 240 and the second electrode 250 due to the stepped coverage.

Hereinafter, a method of manufacturing an OLED lighting apparatus in accordance with a second embodiment of the present disclosure will be described with reference to the accompanying drawings.

FIGS. 7 to 10 are the process cross-sectional views showing a method of manufacturing an OLED lighting apparatus in accordance with a second embodiment of the present disclosure.

Figure 7:
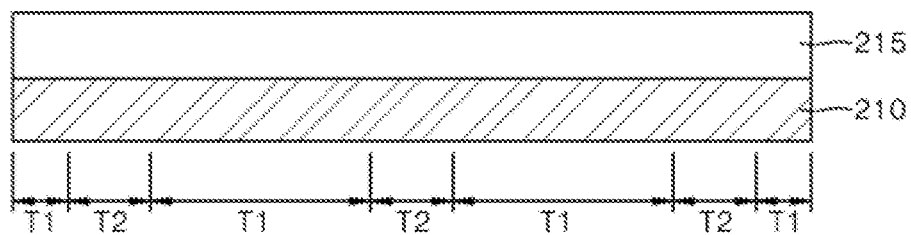
FIG. 7 to FIG. 10 are cross-sectional views showing a method of manufacturing an OLED lighting apparatus in accordance with the second embodiment of the present disclosure.

As shown in FIG. 7, an overcoat layer 215 is formed on an entire surface of a substrate 210. The overcoat layer 215 serves to block moisture and air penetrating from a lower portion of the substrate 210 in addition to flattening a surface of the substrate 210. For this purpose, the overcoat layer 215 may be formed of an organic material including photo acrylic (PAC). In addition, the overcoat layer 215 may be formed of an inorganic material including any one of silicon nitride (SiNx), silicon oxide (SiOx), and aluminum oxide (AlOx). In addition, the overcoat layer 215 may be formed of a plurality of layers including an inorganic layer and an organic layer.

Figure 8:
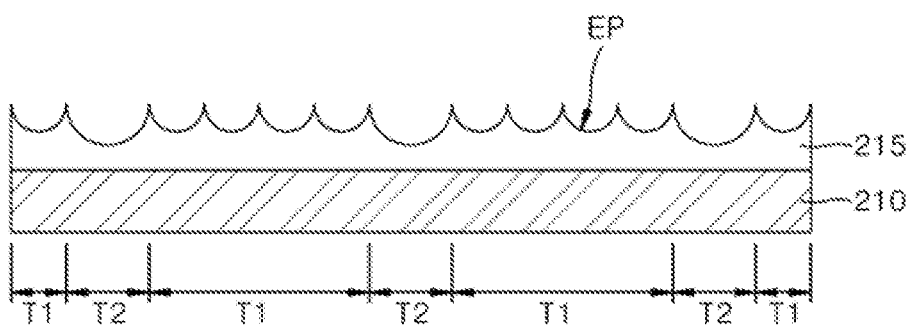

As shown in FIG. 8, after a halftone mask (not shown) is mounted on an upper part spaced apart from an overcoat layer 215 formed on a substrate 210, by a selective exposure and development using the halftone mask, a part of the overcoat layer 215 is patterned to form an embossing pattern EP.

At this time, the halftone mask may include a transparent area, a semi-transparent area, and a blocking area, and the thickness of the embossing pattern EP may be formed differently using a difference in transmission amount of the transparent area and the semi-transparent area.

By way of an example, the embossing pattern EP may be formed by patterning with the selective exposure and development process using the halftone mask without forming a separate photoresist layer (not shown) on the overcoat layer 215. For this purpose, it is more preferable to use an organic material including photo acrylic (PAC) as the overcoat layer 215.

As described above, since the overcoat layer 215 made of the organic material including the photo acrylic (PAC) is a photosensitive material, the patterning can be performed by the selective exposure and development process without forming a separate photoresist layer, and the process is simplified, thereby improving the production yield.

Figure 9:
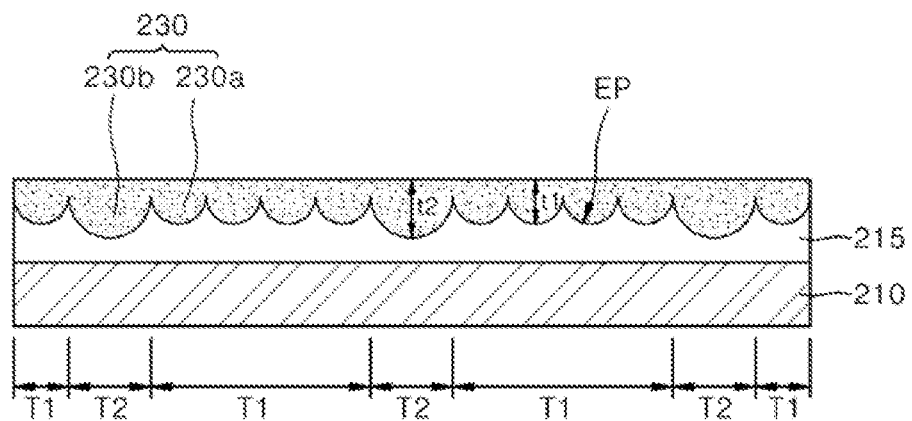

As shown in FIG. 9, a high refractive transparent conductive material is embedded in an embossing pattern EP of an overcoat layer 215, and cured, and the embossing pattern EP is transferred to an interface, with which the overcoat layer 215 is contacted, to form a first electrode 230 having a flat surface.

Accordingly, in the first electrode 230, a light emitting portion 230a having an embossing pattern EP of a first thickness t1 is arranged at a first area T1, and an auxiliary electrode portion 230b having an embossing pattern EP of the second thickness t2 thicker than the first thickness t1 is arranged in a second area T2.

At this time, since the auxiliary electrode portion 230b of the first electrode 230 is formed of the high refractive transparent conductive material, which is identical to that of the light emitting portion 230a of the first electrode 230, a light emitted from an organic light emitting device (E of FIG. 10) can pass through the second area T2, in which the auxiliary electrode portion 230b of the first electrode 230 is arranged, to emit a light.

Accordingly, in a second embodiment of the present disclosure, instead of eliminating an auxiliary line and a protective layer, the first electrode 230 made of a high refractive transparent conductive material is arranged in an entire active area (AA in FIG. 4), a light can be emitted even in a non-light emitting area, so that light extraction efficiency can be improved by maximizing the light emitting area and the lifetime can be improved.

At this time, the high refractive transparent conductive material may include a binder, a conductive material, a light scattering bead, and a solvent. That is, the high refractive transparent conductive material is applied on the overcoat layer 215 in a liquid state in which the binder, the conductive material, and the light scattering bead are mixed with a solvent such as Propylene Glycol Monomethylethylether Acetate (PGMEA), and it is solidified through curing. During curing process, the solvent is volatilized and removed.

As described above, by dispersing the light scattering bead in the first electrode 230, a refractive index difference between the first electrode 230 and the substrate 210 is reduced, and a light reflection at an interface between the first electrode 230 and the substrate 210 is reduced.

At this time, it is preferable that the first electrode 230 may include 100 to 300 parts by weight of the conductive material and 50 to 200 parts by weight of the light scattering bead based on 100 parts by weight of the binder. In addition, the first electrode 230 may further include an additive such as a leveling agent and a surface agent. Such an additive may be added in an amount of 2 parts by weight or less based on 100 parts by weight of the binder.

The binder may include at least one or more selected from tetraethlyorthosilicate (TEOS), silsesquioxane (SSQ), and polysiloxane (Poly siloxane).

The conductive material may include at least one or more selected from poly (3,4-ethylenedioxythiophene) (PEDOT), Carbon Nano Tube (CNT), graphene, Cu-nanowire, Ag-nanowire, and Au-nanowire.

As a light scattering bead, a high refractive light scattering particle can be used. Any material can be used as long as the high refractive light scattering particle has a material having a set refractive index, and specifically, at least one or more selected from $TiO_2$, $BaTiO_3$, $ZrO_2$, $ZnO$, $SiO_2$ and $SiO$, etc., can be used.

Figure 10:
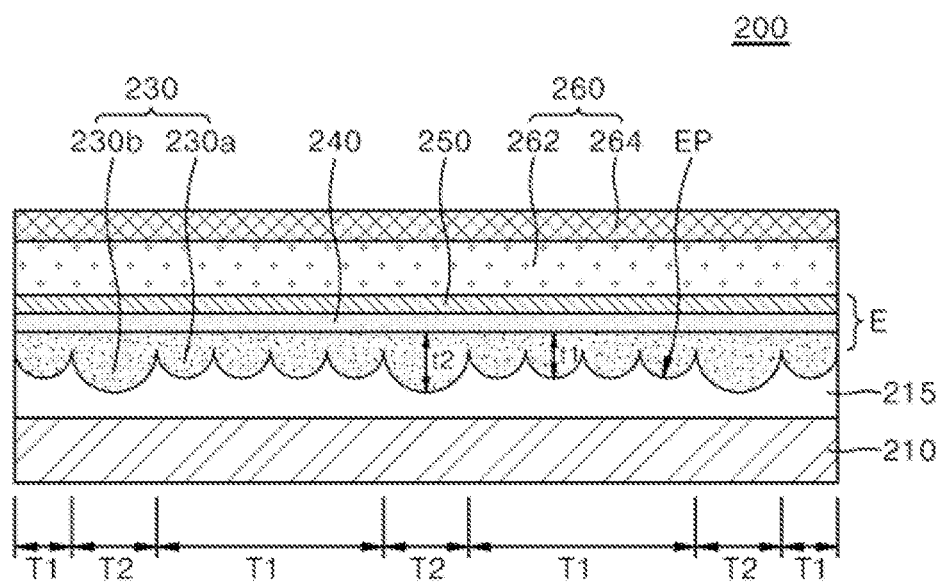

As shown in FIG. 10, after an organic light emitting layer 240 is formed by depositing an organic light emitting material on a first electrode 230 that a surface flattening is made, a metal such as Ca, Ba, Mg, Al, Ag is deposited on the organic light emitting layer 240, and is selectively etched to form a second electrode 250. A first electrode 230, an organic light emitting layer 240, and a second electrode 250 form an organic light emitting device E.

At this time, since a first electrode 230 having a light emitting portion 230a and an auxiliary electrode portion 230b having an embossing pattern EP is coated so as to cover an entire upper portion of an overcoat layer 215 on a substrate 210, it has a flat surface structure, and a stepped coverage does not exist, thereby preventing a disconnection defect of the organic light emitting layer 240 and the second electrode 250 due to the stepped coverage.

Next, after an adhesive layer 262 is formed by applying an adhesive made of a photocurable adhesive material or a thermosetting adhesive material on the substrate 210 on which the organic light emitting device E is formed, a base material layer 264 is attached by a thermal compression in a state in which the base material layer 264 is stacked on the adhesive layer 262 to seal the organic light emitting device E on the substrate 210. At this time, the adhesive layer 262 and the base material layer 264 form an encapsulation layer 260.

While the embodiments of the present disclosure have been mainly described hereinabove, various modifications and changes can be made within a level of those skilled in the art. It is therefore to be understood that such modifications and changes are included within the scope of the present disclosure unless the modifications and changes do not depart from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode (OLED) lighting apparatus, comprising:
   a substrate;
   an overcoat layer on the substrate;
   an organic light emitting layer over the overcoat layer;
   a first electrode between the overcoat layer and the organic light emitting layer, the first electrode and the overcoat layer together defining an embossing pattern at an interface at which the first electrode contacts the overcoat layer between the first electrode and the substrate; and
   a second electrode on the organic light emitting layer,
   wherein the first electrode has a flat surface opposite the embossing pattern.

2. The OLED lighting apparatus of claim 1, wherein the embossing pattern of the first electrode has a curved surface in which a part thereof is embedded inside the overcoat layer.

3. The OLED lighting apparatus of claim 1, wherein the first electrode includes:
   a light emitting portion in which the embossing pattern has a first thickness; and
   an auxiliary electrode portion in which the embossing pattern has a second thickness that is thicker than the first thickness,
   wherein the overcoat layer has curves on a surface of the overcoat layer, the curves are in continuous contact with the light emitting portion and the auxiliary electrode portion of the first electrode.

4. The OLED lighting apparatus of claim 3, wherein the light emitting portion of the first electrode is arranged in a first area and the auxiliary electrode portion of the first electrode is arranged in a second area, wherein the first area and the second area constitute an entire active area on the substrate from which light is emitted, and wherein the first electrode of the second area is arranged in a matrix form in the active area.

5. The OLED lighting apparatus of claim 3, wherein the second thickness is within a range of 150% to 400% of the first thickness.

6. The OLED lighting apparatus of claim 1, wherein the first electrode includes a binder, a conductive material, and a light scattering bead, the first electrode having 100 to 300 parts by weight of the conductive material and 50 to 200 parts by weight of the light scattering bead based on 100 parts by weight of the binder.

7. The OLED lighting apparatus of claim 6, wherein the binder includes at least one or more selected from Tetraethlyorthosilicate (TEOS), Silsesquioxane (SSQ), and polysiloxane (Poly siloxane).

8. The OLED lighting apparatus of claim 6, wherein the conductive material includes at least one or more selected from poly(3,4-ethylenedioxythiophene) (PEDOT), Carbon Nano Tube (CNT), graphene, Cu-nanowire, Ag-nanowire, and Au-nanowire.

9. The OLED lighting apparatus of claim 6, wherein the light scattering bead includes at least one or more selected from $TiO_2$, $BaTiO_3$, $ZrO_2$, $ZnO$, $SiO_2$, and $SiO$.

10. The OLED lighting apparatus of claim 1, further including an encapsulation layer that covers the second electrode and an upper portion of the substrate.

11. The OLED lighting apparatus of claim 1, wherein the substrate is a flexible substrate including a polymer material.

12. The OLED lighting apparatus of claim 1, wherein the embossing pattern has a regular arrangement.

13. The OLED lighting apparatus of claim 1, wherein the embossing pattern of the first electrode is on the lower side of the first electrode.

14. The OLED lighting apparatus of claim 1, wherein the first electrode has a light emitting portion and an auxiliary electrode portion,
wherein the embossing pattern of the light emitting portion has a plurality of first curves and the embossing pattern of the auxiliary electrode portion has a plurality of second curves, and
wherein the first curves are located between the second curves.

15. The OLED lighting apparatus of claim 1, wherein the embossing pattern of the first electrode has a convex portion having a lens shape.

16. The OLED lighting apparatus of claim 1, wherein the embossing pattern of the overcoat layer has a concave portion having a lens shape.

17. An organic light emitting diode (OLED) lighting apparatus, comprising:
a substrate;
an overcoat layer on the substrate, the overcoat layer having a surface opposite the substrate that includes a plurality of first indentations and a plurality of second indentations, the second indentations extending deeper toward the substrate than the first indentations;
a first electrode on the overcoat layer, the first electrode having a first surface including a plurality of first curves in contact with the plurality of first indentations of the overcoat layer and a plurality of second curves in contact with the plurality of second indentations of the overcoat layer;
an organic light emitting layer on a second surface of the first electrode, the second surface being opposite the first surface of the first electrode; and
a second electrode on the organic light emitting layer.

18. The OLED lighting apparatus of claim 17, wherein the first electrode covers an entire upper portion of the overcoat layer on the substrate, and the second surface of the first electrode is substantially flat.

19. The OLED lighting apparatus of claim 17, wherein the plurality of first curves of the first electrode correspond with a light emitting portion of the first electrode, the plurality of second curves of the first electrode correspond with an auxiliary electrode portion of the first electrode, the first electrode has a first thickness in the light emitting portion, and the first electrode has a second thickness that is greater than the first thickness in the auxiliary electrode portion.

* * * * *